United States Patent
Tsuruda (10) Patent No.: US 8,801,891 B2
(45) Date of Patent: Aug. 12, 2014

(54) SUBSTRATE WARPAGE REMOVAL APPARATUS AND SUBSTRATE PROCESSING APPARATUS

(75) Inventor: Toyohisa Tsuruda, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 42 days.

(21) Appl. No.: 13/479,673

(22) Filed: May 24, 2012

(65) Prior Publication Data

US 2012/0301832 A1 Nov. 29, 2012

(30) Foreign Application Priority Data

May 27, 2011 (JP) .................................. 2011-119528

(51) Int. Cl.
*B32B 38/10* (2006.01)
*G03F 7/20* (2006.01)
*B44C 1/22* (2006.01)

(52) U.S. Cl.
USPC ..................... 156/345.16; 156/702; 156/751

(58) Field of Classification Search
USPC .............. 118/663, 719; 156/345.16, 702, 751
See application file for complete search history.

(56) References Cited

U.S. PATENT DOCUMENTS

| 7,229,926 | B2 | 6/2007 | Matsumoto | |
|---|---|---|---|---|
| 7,446,045 | B2 | 11/2008 | Matsumoto | |
| 8,012,882 | B2 | 9/2011 | Matsumoto | |
| 2005/0009349 | A1* | 1/2005 | Kassir | 438/689 |
| 2007/0257085 | A1* | 11/2007 | Fukuda et al. | 228/101 |
| 2008/0050886 | A1* | 2/2008 | Hirota | 438/424 |
| 2009/0196588 | A1* | 8/2009 | Nakagawa | 392/416 |

FOREIGN PATENT DOCUMENTS

JP    2005-136167 A1    5/2005

* cited by examiner

*Primary Examiner* — Parviz Hassanzadeh
*Assistant Examiner* — Nathan K Ford
(74) *Attorney, Agent, or Firm* — Burr & Brown, PLLC (57) ABSTRACT

There is provided a substrate warpage removal apparatus and method which can remove warpage of a substrate which has a patterned surface having a film with a pattern, and a non-patterned surface having a film without a pattern. The substrate warpage removal apparatus includes: a holding plate configured to hold a substrate; a processing liquid supply pipe, provided on the side of the non-patterned surface of the substrate, configured to supply an etching liquid to the surface to remove a surface film; and a first laser displacement meter and a second laser displacement meter configured to detect warpage of the substrate. When the controller, based on signals from the first laser displacement meter and the second laser displacement meter, determines that warpage of the substrate has been eliminated, the controller stops the supply of an etching liquid from the processing liquid supply pipe.

2 Claims, 9 Drawing Sheets

FIG. 10

SUBSTRATE WARPAGE REMOVAL APPARATUS AND SUBSTRATE PROCESSING APPARATUS

CROSS-REFERENCE TO RELATED APPLICATION

This application claims the priority benefit of Japanese Patent Application No. 2011-119528, filed on May 27, 2011, the disclosure of which is incorporated herein by reference in its entirety.

1. FIELD OF THE INVENTION

The present invention relates to a substrate warpage removal apparatus, a substrate warpage removal method and a storage medium for removing warpage of a substrate, such as a semiconductor wafer or an LCD (liquid crystal display) glass substrate, in advance of performing predetermined processing of the substrate, such as application of a liquid resist and the subsequent exposure and development, by supplying a processing liquid to a surface of the substrate, so that the processing can be performed with good accuracy.

2. DESCRIPTION OF RELATED ART

In the process of manufacturing a semiconductor device or an LCD substrate, a resist pattern is formed in a substrate by a technique called photolithography. The technique involves the steps of forming in advance a multi-layer film, e.g. by CVD or PVD, on a surface of a substrate such as a semiconductor wafer (hereinafter simply referred to as "wafer"), applying a liquid resist onto the substrate surface to form a liquid film on the surface, exposing the resist film on the substrate by using a photomask, and developing the exposed resist film, thereby forming an intended resist pattern on the multi-layer film of the substrate.

Thereafter, the substrate is subjected to etching using the resist pattern as a mask, thereby forming a film having an intended pattern on the substrate.

The formation of a resist pattern and the subsequent etching, carried out in the above-described manner, are repeated to form multi-layer films, each having an intended pattern, successively on the substrate.

When forming such multi-layer films, each having an intended pattern, on a substrate, it is common practice to form in advance multi-layer films by CVD or PVD on the front and back surfaces of the substrate, and then repeat the formation of a resist pattern and etching. The intended patterns are formed only in the multi-layer films on one surface (patterned surface) of the substrate, and are not formed in the multi-layer films in the other surface (non-patterned surface).

When a pattern is thus formed only in a film on the one surface (patterned surface) of a substrate, whereas no pattern is formed in the corresponding film in the other surface (non-patterned surface) of the substrate, the substrate will warp with the patterned surface becoming either convex or concave.

Such warpage of a substrate can adversely affect the formation of an additional resist pattern on the substrate in the next process.

For example, when a warped substrate is heated by means of a hot plate in a resist pattern forming process, heat may not transfer uniformly from the hot plate to the substrate. Further, it is possible that a warped substrate cannot be exposed with good accuracy in an exposure step.

Prior Art Document

Patent document 1: Japanese Patent Laid-Open Publication No. 2005-136167

SUMMARY OF THE INVENTION

The present invention has been made in order to solve the above problems. It is therefore an object of the present invention to provide a substrate warpage removal apparatus and a substrate warpage removal method which can remove warpage of a substrate in which only a film formed in one surface has a pattern, whereas a film formed in the other surface has no pattern, and which is therefore likely to warp.

In order to achieve the object, the present invention provides a substrate warpage removal apparatus comprising a substrate holding section configured to hold a substrate which has a patterned surface having a film with a pattern, and a non-patterned surface lying on the opposite side from the patterned surface and having a film without a pattern, a film removal section, provided on the side of the non-patterned surface of the substrate, configured to remove the film of the non-patterned surface, a substrate warpage detection section configured to detect a degree of warpage of the substrate, and a controller configured to control the film removal section, wherein the controller determines when to stop the actuation of the film removal section based on a signal from the substrate warpage detection section.

The controller may stop the actuation of the film removal section, when judging from the signal from the substrate warpage detection section that warpage of the substrate has been eliminated.

The film removal section may be a processing liquid supply section.

Preferably, the processing liquid supply section includes a processing liquid supply pipe which is connected to an etching liquid supply system configured to supply an etching liquid to the processing liquid supply pipe.

In a preferred embodiment of the present invention, the substrate holding section holds the substrate with the non-patterned surface downward; and the processing liquid supply section is disposed below the substrate and supplies a processing liquid to the non-patterned surface of the substrate.

In a preferred embodiment of the present invention, the substrate warpage detection section includes a first laser displacement meter configured to measure a displacement of the center of a surface of the substrate, and a second laser displacement meter configured to measure a displacement of the periphery of the surface of the substrate.

The present invention also provides a substrate processing apparatus comprising the above-described substrate warpage removal apparatus, a resist application module configured to apply a liquid resist to a substrate after removing warpage of the substrate by means of the substrate warpage removal apparatus, and a substrate transport configured to transport the substrate between the substrate warpage removal apparatus and the resist application module.

The present invention also provides a substrate warpage removal method using a substrate warpage removal apparatus comprising a substrate holding section configured to hold a substrate which has a patterned surface having a film with a pattern, and a non-patterned surface lying on the opposite side from the patterned surface and having a film without a pattern, a film removal section, provided on the side of the non-patterned surface of the substrate, configured to remove the film of the non-patterned surface, a substrate warpage detection section configured to detect a degree of warpage of the substrate, and a controller configured to control the film removal section, wherein the controller determines when to stop the actuation of the film removal section based on a signal from the substrate warpage detection section, the method comprising holding the substrate by means of the substrate holding section, removing the film of the non-patterned surface by means of the film removal section, and detecting the degree of warpage of the substrate by means of the substrate warpage detection section, wherein when the controller, based on a signal from the substrate warpage detection section, determines that warpage of the substrate has been eliminated, then the controller stops the actuation of the film removal section.

In a preferred embodiment of the present invention, the detection of the degree of warpage of the substrate by means of the substrate warpage detection section is performed during the removal of the film.

In a preferred embodiment of the present invention, the film removal section is a processing liquid supply section and, when the film is removed, a processing liquid is supplied from the processing liquid supply section to the non-patterned surface of the substrate.

The processing liquid may preferably be an etching liquid.

In a preferred embodiment of the present invention, the substrate holding section holds the substrate with the non-patterned surface downward; and the processing liquid supply section is disposed below the substrate and supplies the processing liquid to the non-patterned surface of the substrate.

In a preferred embodiment of the present invention, the substrate warpage detection section includes a first laser displacement meter and a second laser displacement meter and, when detecting the degree of warpage of the substrate, the first laser displacement meter measures a displacement of the center of a surface of the substrate, and the second laser displacement meter measures a displacement of the periphery of the surface of the substrate.

The present invention also provides a substrate processing method comprising applying a liquid resist to a substrate by means of a resist application module after removing warpage of the substrate by the above-described substrate warpage removal method.

After the application of the liquid resist to the substrate, the substrate may be subjected to exposure by means of an exposure apparatus.

The present invention also provides a storage medium storing a computer program for causing a substrate warpage removal apparatus to perform a substrate warpage removal method, the substrate warpage removal method using the substrate warpage removal apparatus comprising a substrate holding section configured to hold a substrate which has a patterned surface having a film with a pattern, and a non-patterned surface lying on the opposite side from the patterned surface and having a film without a pattern, a film removal section, provided on the side of the non-patterned surface of the substrate, configured to remove the film of the non-patterned surface, a substrate warpage detection section configured to detect a degree of warpage of the substrate; and a controller configured to control the film removal section, wherein the controller determines when to stop the actuation of the film removal section based on a signal from the substrate warpage detection section, the method comprising holding the substrate by means of the substrate holding section, removing the film of the non-patterned surface by means of the film removal section, and detecting the degree of warpage of the substrate by means of the substrate warpage detection section, wherein when the controller, based on a signal from the substrate warpage detection section, determines that warpage of the substrate has been eliminated, then the controller stops the actuation of the film removal section.

According to the present invention, warpage of a substrate can be removed by removing a film, formed on a non-patterned surface of the substrate, by means of the film removal section. During the removal of the film, the substrate warpage detection section detects the degree of warpage of the substrate. When the controller, based on a signal from the substrate warpage detection section, determines that warpage of the substrate has been eliminated, the controller stops the actuation of the film removal section. This method enables easy and high-accuracy removal of warpage of a substrate.

DETAILED DESCRIPTION OF THE INVENTION

Figure 9:
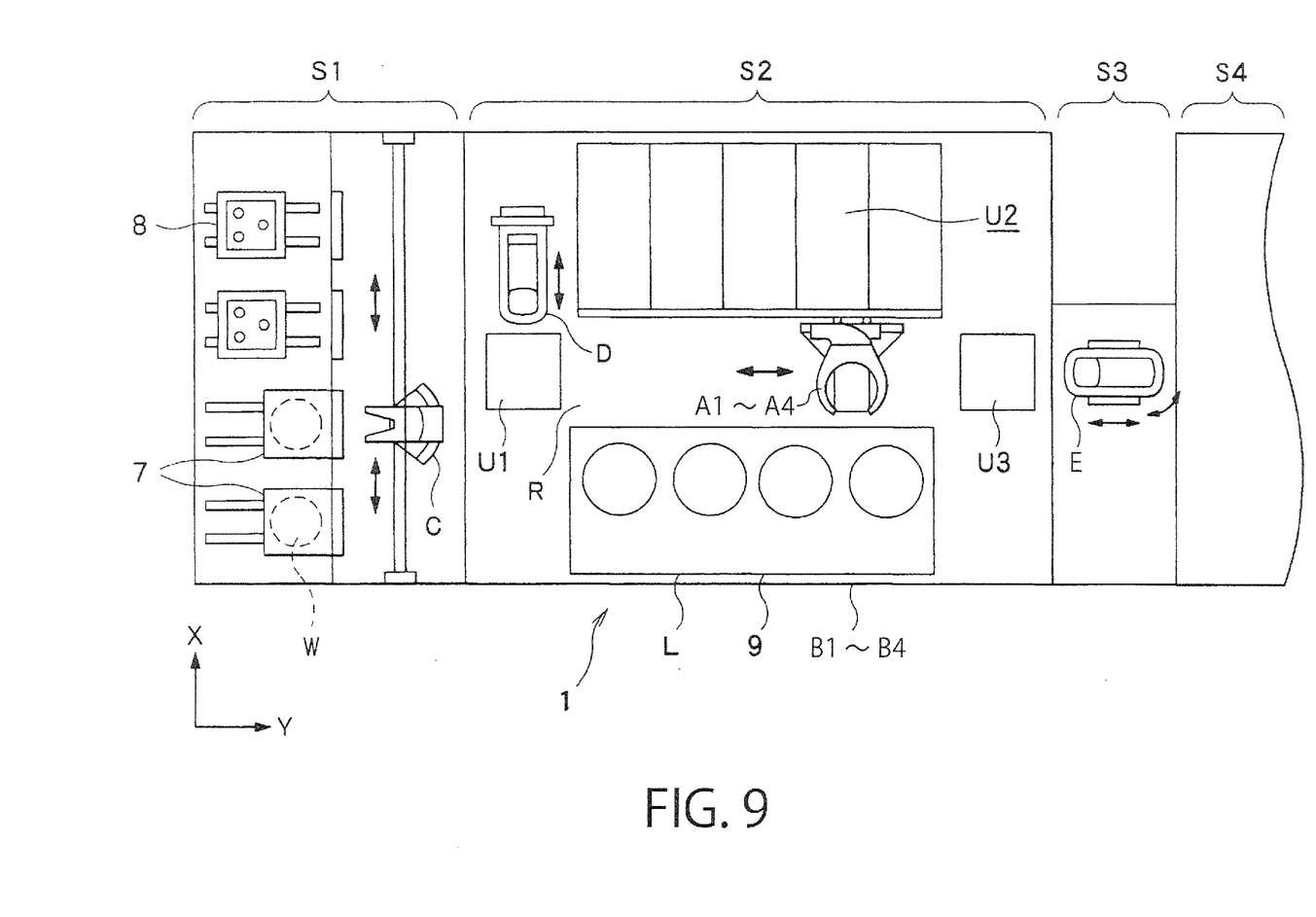
FIG. 9 is a plan view showing a resist pattern forming apparatus incorporating a substrate warpage removal apparatus.
Figure 10:
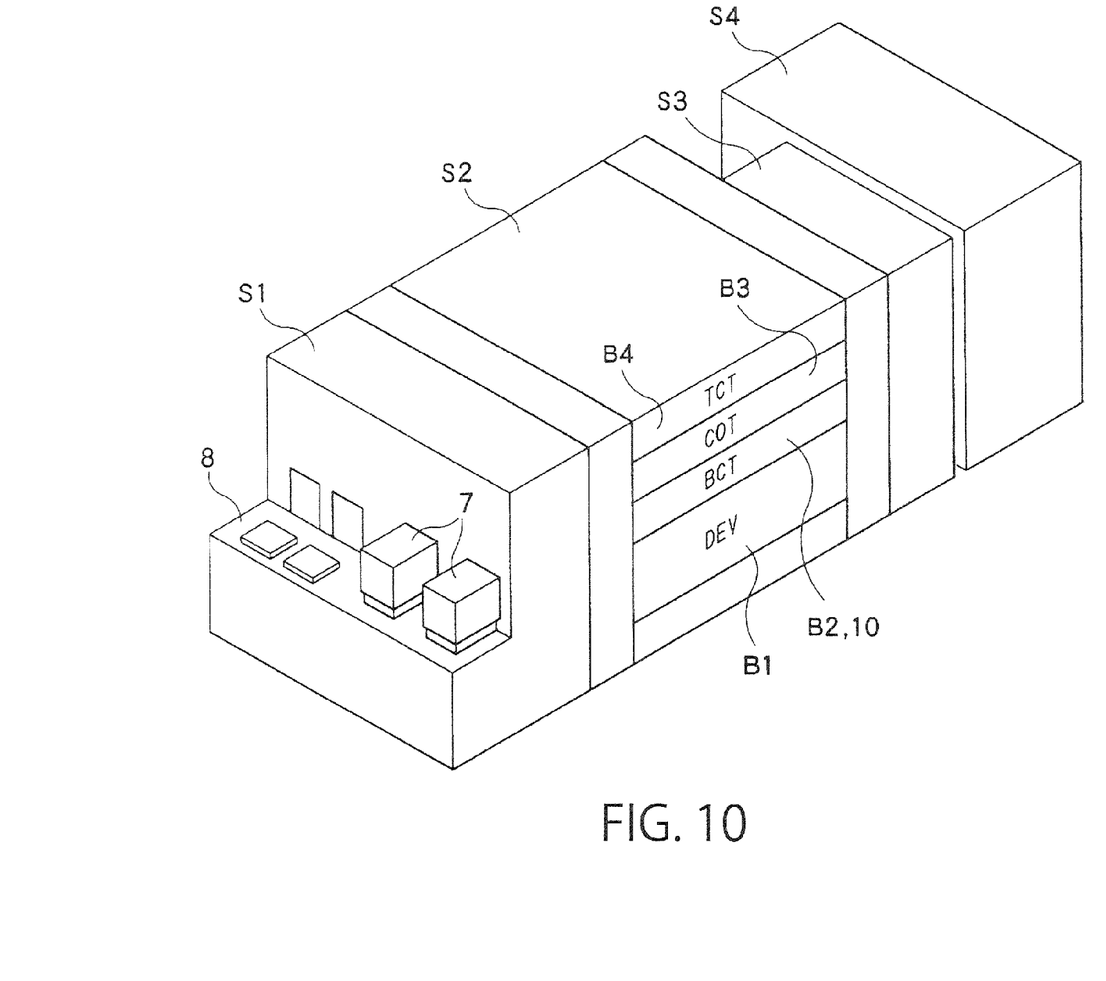
FIG. 10 is a perspective view showing a resist pattern forming apparatus incorporating a substrate warpage removal apparatus.

Preferred embodiments of the present invention will now be described with reference to the drawings. First, an exemplary resist pattern forming apparatus incorporating a substrate warpage removal apparatus will be briefly described with reference to FIGS. 9 and 10. FIG. 9 is a plan view of a resist pattern forming apparatus according to an embodiment of the present invention, and FIG. 10 is a schematic perspective view of the resist pattern forming apparatus. The resist pattern forming apparatus 1 includes a carrier block S1, a processing block S2, an interface block S3, and an exposure apparatus S4. In the carrier block S1, a transfer means C takes a wafer (substrate) W out of an airtight carrier 7 placed on a stage 8, and transfers the wafer to the processing block S2 adjacent to the carrier block S1. The transfer means C receives a processed wafer W after processing in the processing block S2, and returns the wafer W to the carrier 7.

The processing block S2 includes a first block (DEV layer) B1 for performing development processing, a second block (BCT layer) B2 for forming an antireflective film underlying a resist film, a third block (COT layer) B3 for performing application of a liquid resist, and a fourth block (TCT layer) B4 for forming an antireflective film overlying the resist film. The most upstream part of the processing block S2, e.g. the second block B2, incorporates a substrate warpage removal apparatus 10 according to the present invention.

The first to fourth blocks B1 to B4 have similar constructions and include a shelf unit U1 composed of a stack of transfer modules for transferring a wafer W between the blocks, liquid processing modules L each for applying a liquid chemical to a wafer W, a shelf unit U2 composed of a stack of heating/cooling modules for performing pretreatment or post-treatment for processing performed in the liquid processing modules L, and transport arms A1 to A4 as transport means for transferring a wafer W between the modules of the shelf units U1, U2 and the liquid processing modules L.

As shown in FIG. 9, the first to fourth blocks B1 to B4 each have a transport route R extending in the Y direction shown in the Figure. The transport arms A1 to A4 are each configured to be movable back and forth, vertically movable, rotatable on a vertical axis and movable in the Y direction on the transport route R. The transport arms A1 to A4 each have two forks for supporting a peripheral area of the back surface of a wafer W. The two forks are movable back and forth independently of each other.

The liquid processing modules L and the shelf unit U2 are disposed opposite each other along the transport route R. In each of the second to fourth blocks B2 to B4, a plurality of, e.g. four, liquid processing modules are arranged along the transport route R. The liquid processing modules of the second block B2 are each a liquid processing module BCT for applying onto a wafer a liquid chemical for forming an antireflective film underlying a resist film; the liquid processing modules of the third block B3 are each a liquid processing module COT for applying a liquid resist onto a wafer; and the liquid processing modules of the fourth block B4 are each a liquid processing module TCT for applying onto a wafer a liquid chemical for forming an antireflective film overlying a resist film. In the first block B1, four two-stage liquid processing modules DEV are provided along the transport route R. Each module DEV is configured to apply a developer to a wafer.

As shown in FIG. 9, a wafer W is transported between the modules of the shelf unit U1 by a vertically movable transfer arm D provided near the shelf unit U1. The shelf unit U1 is comprised of a stack of transfer modules, including a transfer module which also functions as a cooling unit for temperature control and a transfer module which also functions as a buffer capable of placing a plurality of wafers W thereon. The shelf unit U2 incorporates e.g. a heating module for heating a wafer W. The first block (DEV layer) B1 is also provided with a shelf unit U3 disposed near the interface block 53. The shelf unit U3 is comprised of a stack of transfer modules for transferring a wafer W between the block B1 and the interface block S3.

An exemplary flow of a wafer (substrate) W in the thus-constructed resist pattern forming apparatus 1 will now be described. Wafers W from the carrier block S1 are sequentially transported by the transfer means C to one of the transfer modules of the shelf unit U1, for example the transfer module corresponding to the second block B2, and are thus carried into the second block B2. Each wafer W is then subjected to warpage removal processing in the substrate warpage removal apparatus 10 located in a most upstream position in the second block B2. The wafer W is then transported in the second block B2 along the following course: liquid processing module BCT→heating module GHA→transfer module of the shelf unit U1; an antireflective film is formed on the wafer W.

Thereafter, the wafer W is transported by the transfer arm D to that transfer module of the shelf unit U1 which corresponds to the third block B3. The wafer W is then transported by the transport arm A3 in the third block B3 along the following course: liquid processing module COT→heating module GHA→transfer module of the shelf unit U1; a resist film is formed on the antireflective film of the wafer W. In some cases, an additional antireflective film is formed on the resist film of the wafer W in the fourth block B4.

The wafer W, having the resist film and optionally the additional antireflective film, is directly transported to the transfer module of the shelf unit U3 and is then carried into the interface block S3.

Subsequently, the wafer W is transported by an interface arm E to the exposure apparatus 54, where the wafer W is subjected to predetermined exposure processing. Thereafter, the wafer W is returned to the processing block S2 and placed on a transfer module of the shelf unit U3. The wafer W is then subjected to developing processing in the first block B1, and returned by the transfer means C to the carrier 7.

Figure 1:
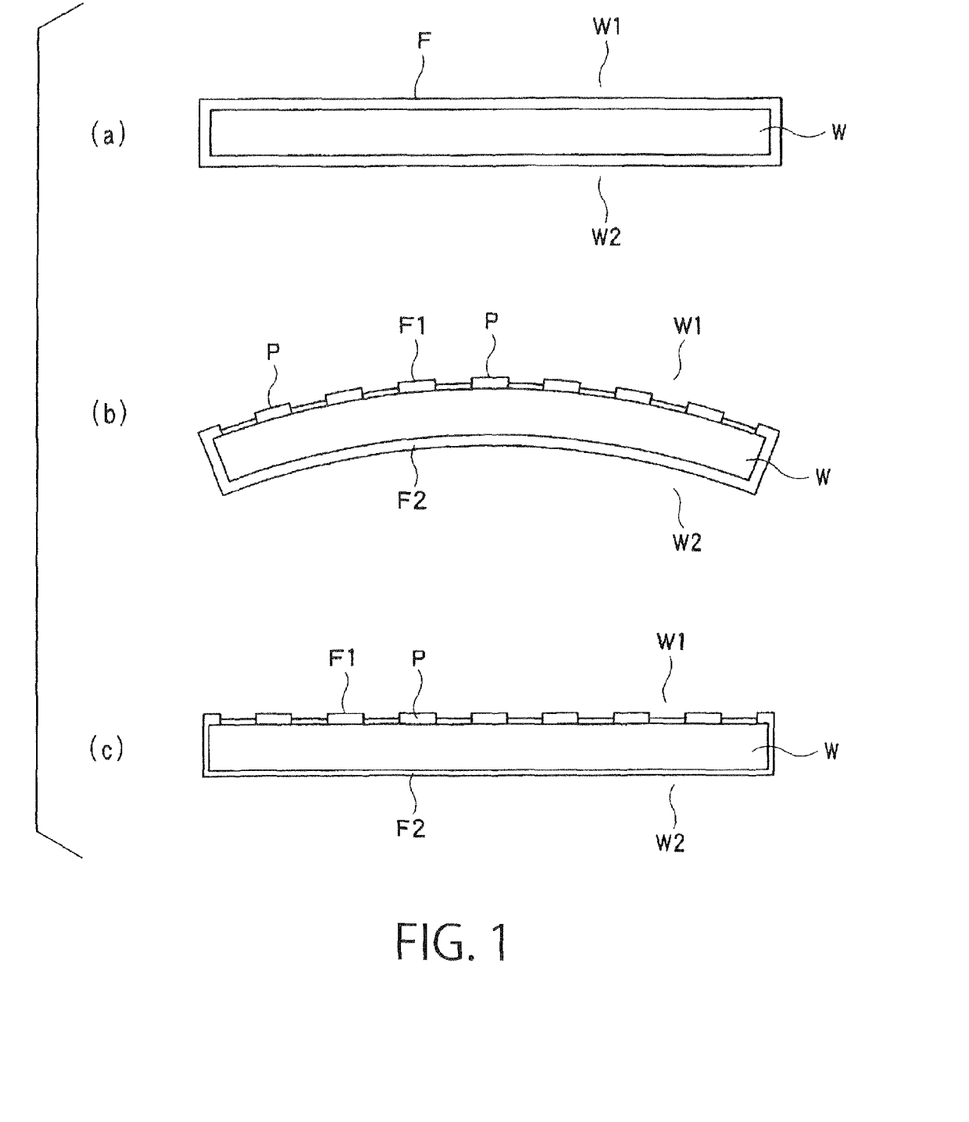
FIGS. 1(a) through 1(c) are diagrams illustrating the action of a substrate warpage removal apparatus according to the present invention.
Figure 2:
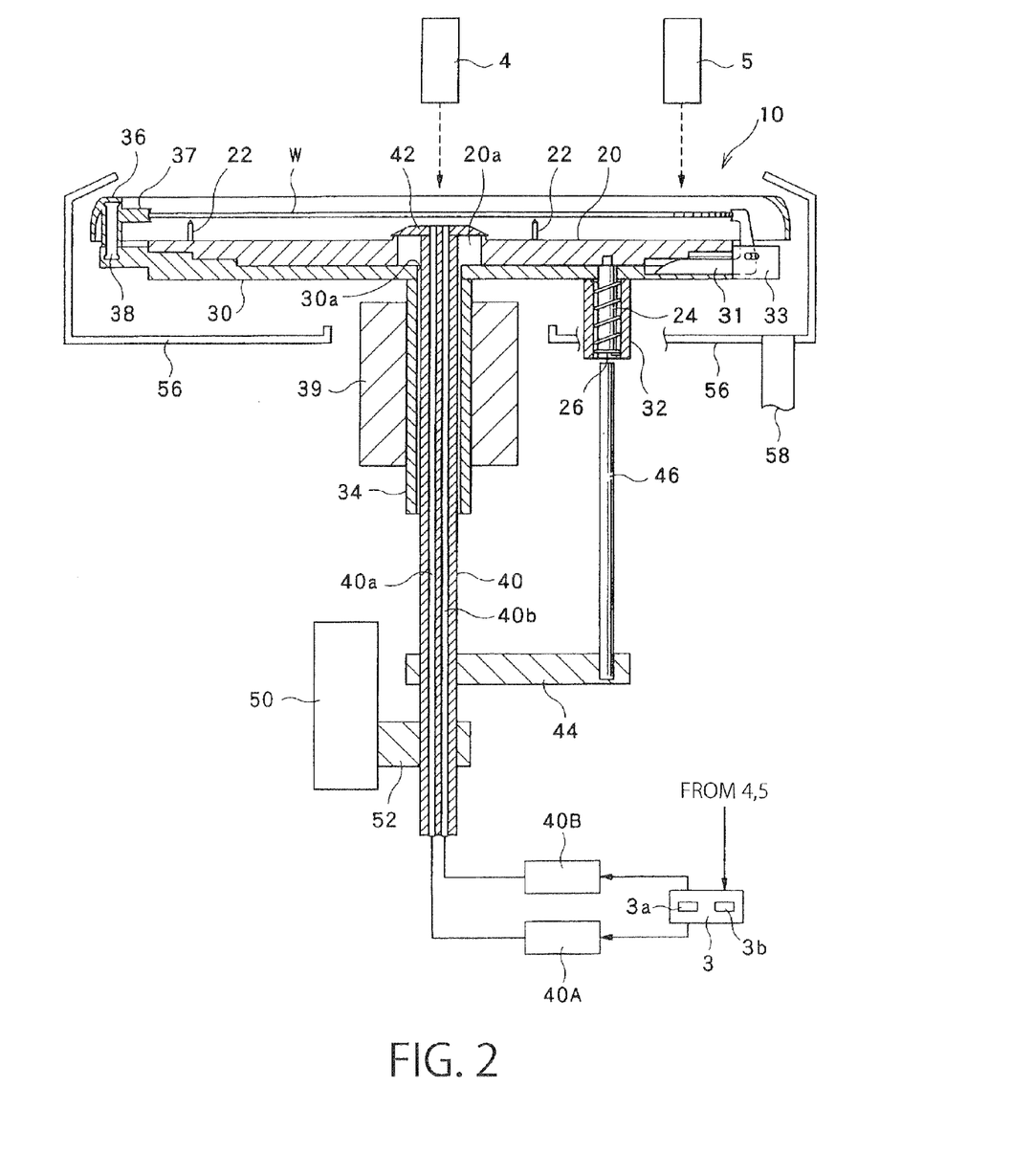
FIG. 2 is a vertical sectional view showing the construction of a substrate warpage removal apparatus according to an embodiment of the present invention, illustrating the apparatus when a lift pin plate and a processing liquid supply pipe each lie in a lower position.
Figure 3:
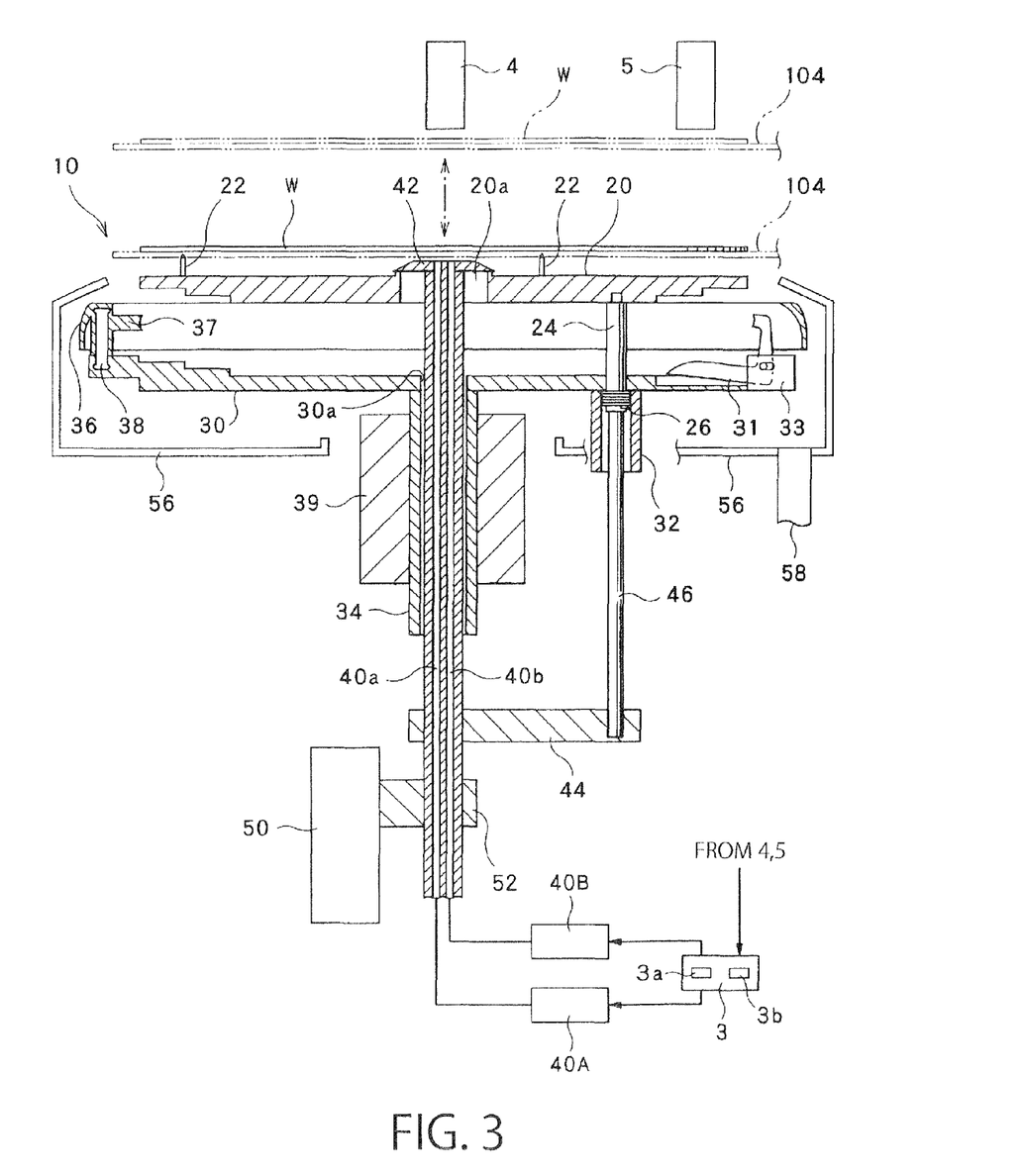
FIG. 3 is a vertical sectional view showing the construction of a substrate warpage removal apparatus according to an embodiment of the present invention, illustrating the apparatus when a lift pin plate and a processing liquid supply pipe each lie in an upper position.
Figure 4:
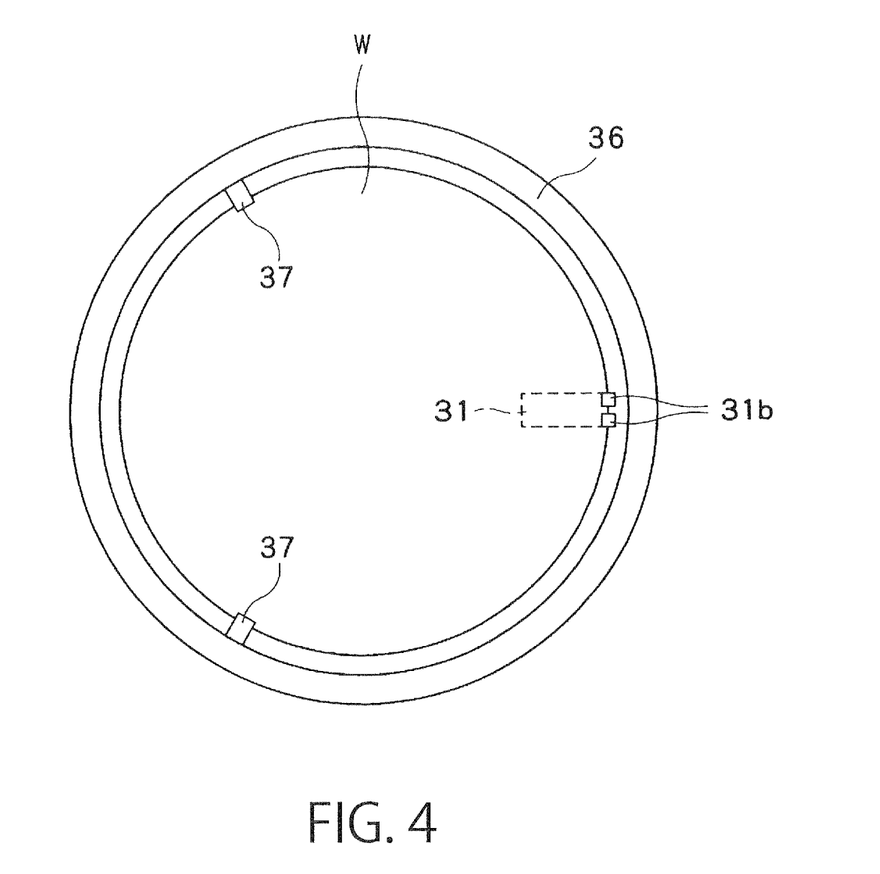
FIG. 4 is a top view of the substrate warpage removal apparatus shown in FIG. 2, illustrating the apparatus when a wafer is held by a substrate support and fixing/holding portions.
Figure 5:
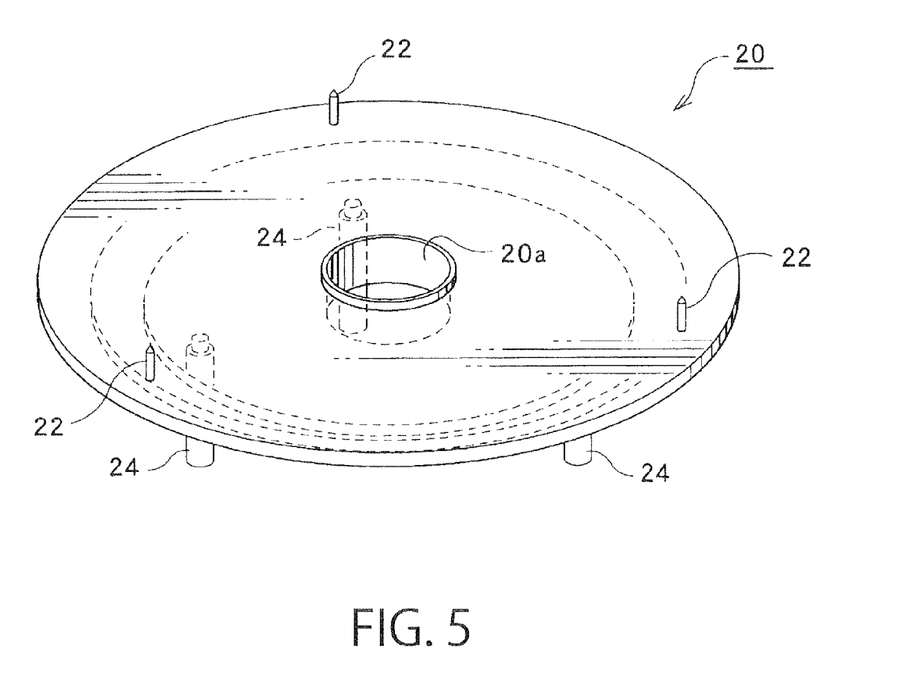
FIG. 5 is a perspective view showing the construction of the lift pin plate of the substrate warpage removal apparatus shown in FIGS. 2 and 3.
Figure 6:
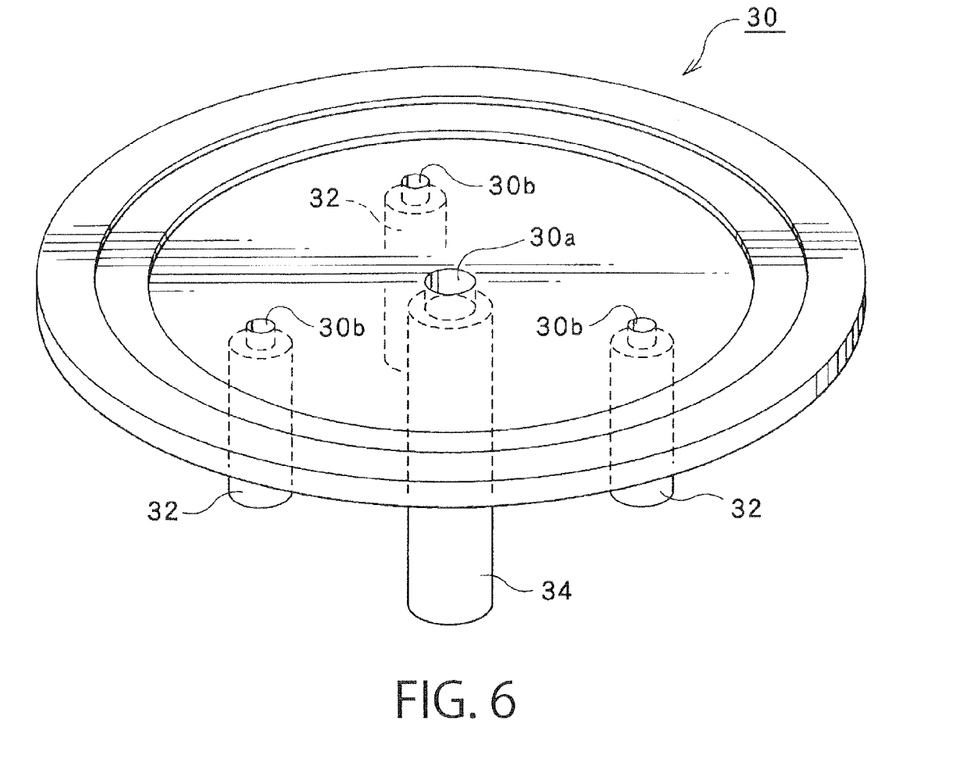
FIG. 6 is a perspective view showing the construction of the holding plate of the substrate warpage removal apparatus shown in FIGS. 2 and 3.
Figure 7:
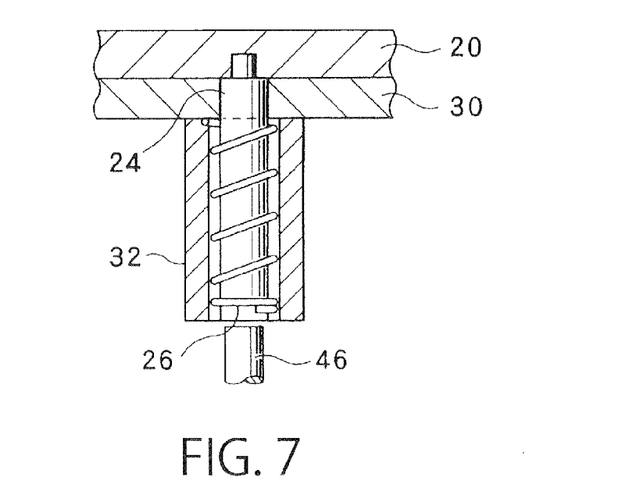
FIG. 7 is an enlarged vertical sectional view showing the detailed construction of a hollow housing member, provided in the substrate warpage removal apparatus shown in FIGS. 2 and 3, for housing a connecting member extending downward from the lift pin plate and extending downward from the holding plate.
Figure 8:
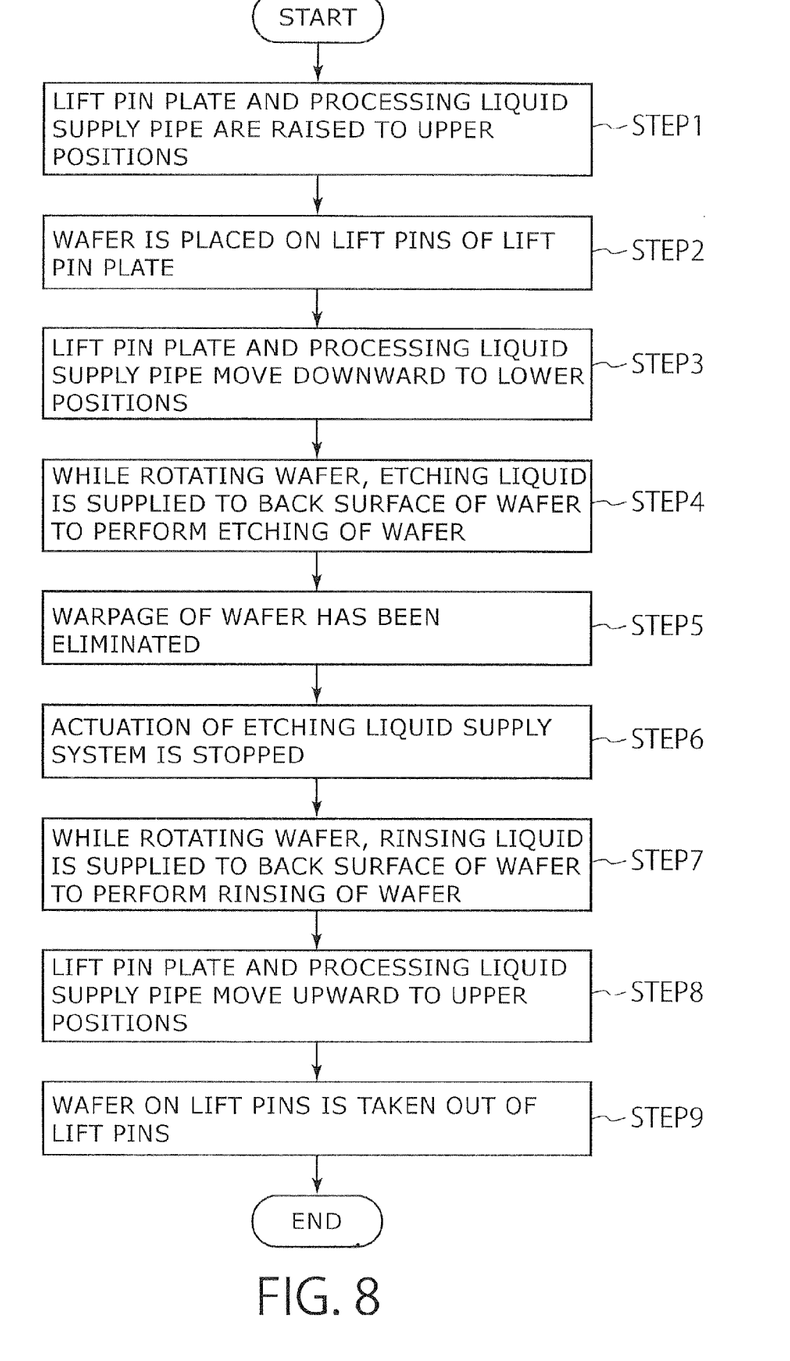
FIG. 8 is a flow chart showing a substrate warpage removal method according to an embodiment of the present invention.

The substrate warpage removal apparatus 10 according to the present invention will now be described with reference to FIGS. 1 through 8. FIGS. 1 through 8 are diagrams illustrating the substrate warpage removal apparatus according to an embodiment of the present invention. In particular, FIGS. 1(a) through 1(c) are diagrams illustrating the action of the substrate warpage removal apparatus. FIGS. 2 and 3 are vertical sectional views showing the construction of the substrate warpage removal apparatus, and FIG. 4 is a top view of the substrate warpage removal apparatus shown in FIG. 2, illustrating the apparatus when a wafer is held by a substrate support and fixing/holding portions. FIG. 5 is a perspective view showing the construction of the lift pin plate of the substrate warpage removal apparatus shown in FIGS. 2 and 3, and FIG. 6 is a perspective view showing the construction of the holding plate of the substrate warpage removal apparatus shown in FIGS. 2 and 3. FIG. 7 is an enlarged vertical sectional view showing the detailed construction of a hollow housing member, provided in the substrate warpage removal apparatus shown in FIGS. 2 and 3, for housing a connecting member extending downward from the lift pin plate and extending downward from the holding plate. FIG. 8 is a flow chart showing a substrate warpage removal method according to an embodiment of the present invention.

The schematic construction of the substrate warpage removal apparatus 10 will be described with reference to FIGS. 2 and 3. The substrate warpage removal apparatus 10 includes a holding plate 30 for holding a wafer W, a lift pin plate 20 provided over the holding plate 30 and having lift pins 22 for supporting the wafer W from below, a rotational drive section 39 for rotating the holding plate 30, and a processing liquid supply pipe 40, passing through a through-hole 30a formed in the center of the holding plate 30 and a through-hole 20a formed in the center of the lift pin plate 20, for supplying a processing liquid, such as pure water (rinsing liquid) or an etching liquid, to the back surface of the wafer W held by the holding plate 30. The lift pin plate 20 is configured to rotate in conjunction with the rotation of the holding plate 30. The processing liquid supply pipe 40 has a head portion 42 which is provided to close the through-hole 20a of the lift pin plate 20.

The holding plate 30 for holding a wafer W, together with the rotational drive section 39 for rotating the holding plate 30, constitutes a substrate holding section. The processing liquid supply pipe 40 constitutes a film removal section for removing a film.

Referring to FIGS. 2 and 3, the lift pin plate 20 and the processing liquid supply pipe 40 are configured to move vertically relative to the holding plate 30. FIG. 2 illustrates the apparatus when the lift pin plate 20 and the processing liquid supply pipe 40 each are located in a lower position, while FIG. 3 illustrates the apparatus when the lift pin plate 20 and the processing liquid supply pipe 40 each are located in an upper position. The lift pin plate 20 and the processing liquid supply pipe 40 are configured to move vertically between the lower positions shown in FIG. 2 and the upper positions shown in FIG. 3.

As shown in FIGS. 1(a) through 1(c), a wafer W, to be subjected to warpage removal processing by means of the substrate warpage removal apparatus 10, has a front surface W1 and a back surface W2. A film F1 having a pattern P is formed in the front surface (patterned surface) W1, whereas a film F2 having no pattern is formed in the back surface (non-patterned surface) W2.

The film F2 is removed by supplying an etching liquid to the back surface W2 of the wafer W by means of the substrate warpage removal apparatus 10, thereby removing warpage of the wafer W, as described below.

The components of the thus-constructed substrate warpage removal apparatus 10 will now be described in greater detail.

As shown in FIG. 5, the lift pin plate 20 is disk-shaped and has the through-hole 20a formed in the center. The processing liquid supply pipe 40 is inserted through the through-hole 20a. On the front surface of the lift pin plate 20 are provided three lift pins 22 disposed near the peripheral edge and arranged at even intervals in the circumferential direction. On the back surface (opposite from the surface having the lift pins 22) of the lift pin plate 20 are provided three rod-like connecting members 24 disposed near the peripheral edge and arranged at even intervals in the circumferential direction. The connecting members 24 each extend downward from the back surface of the lift pin plate 20.

As shown in FIG. 6, the holding plate 30 is disk-shaped and has the through-hole 30a formed in the center. The processing liquid supply pipe 40 is inserted through the through-hole 30a. A rotating cup 36 is mounted by a connecting member 38 to the front surface of the holding plate 30. As shown in FIG. 2, when the lift pin plate 20 and the processing liquid supply pipe 40 are located in the lower positions, the rotating cup 36 surrounds the peripheral end of a wafer W held by the holding plate 30, as shown in FIGS. 2 and 3. As shown in FIGS. 2 and 4, the rotating cup 36 has two fixing/holding portions 37 for holding a wafer W. The function of the fixing/holding portions 37 will be described in more detail below.

A hollow rotating shaft 34, extending downward from the back surface (opposite from the surface having the rotating cup 36) of the holding plate 30, is mounted in the center of the back surface of the holding plate 30. The processing liquid supply pipe 40 is housed in the hollow portion of the rotating shaft 34. The rotating shaft 34 is configured to be rotated by the rotational drive section 39 e.g. via a bearing (not shown). The holding plate 30 also rotates when the rotational drive section 39 rotates the rotating shaft 34.

As shown in FIG. 6, the holding plate 30 has three through-holes (connecting member through-holes) 30b, arranged at even intervals in the circumferential direction, for allowing passage therethrough of the rod-like connecting members 24 extending downward from the back surface of the lift pin plate 20. Three cylindrical housing members 32 are provided on the back surface of the holding plate 30 at the locations of the through-holes 30b. The housing members 32 each extend downward from the back surface of the holding plate 30 so as to house each of the connecting members 24 that extend downward from the back surface of the lift pin plate 20.

As shown in FIG. 7, the inner diameter of each cylindrical housing member 32 is slightly larger than the diameter of each connecting member 24 so that the connecting member 24 can move within the housing member 32 in the longitudinal direction (vertical direction in FIG. 7) of the housing member 32. As shown in FIG. 2, when the lift pin plate 20 is in the lower position, each connecting member 24 is fully housed in each housing member 32. Therefore, when the holding plate 30 is rotated, the lift pin plate 20 is also rotated by the connecting members 24. On the other hand, as shown in FIG. 3, when the lift pin plate 20 is in the upper position, only a lower portion of each connecting member 24 is housed in each cylindrical housing member 32; the connecting member 24 passes through the through-hole 30b formed in the holding plate 30 and projects upward from the holding plate 30.

As shown in FIG. 7, a spring 26 in a compressed state is housed in the hollow portion of each housing member 32. The spring 26, at its lower end, is mounted to the lower end of the connecting member 24 and, at its upper end, is mounted to the lower surface of the holding plate 30 in the vicinity of the through-hole 30b. Accordingly, the connecting member 24 is biased downward by the spring 26. Thus, a downward force (that tries to move the connecting member 24 downward from the holding plate 30) continually acts on the connecting member 24.

As shown in FIGS. 2 and 3, an outer cup 56 is provided outside the rotating cup 36; the holding plate 30 and the rotating cup 56 are covered by the outer cup 56. A drainage pipe 58 is connected to the outer cup 56 so that a processing liquid, such as a rinsing liquid or an etching liquid, which has been used for rinsing or etching of a wafer W and which has been scattered outward from the wafer W due to the rotation of the wafer W and received by the outer cup 56, is discharged through the drainage pipe 58.

As shown in FIG. 2, the holding plate 30 is provided with a substrate support 31 for supporting a wafer W from the side. The substrate support 31 supports the wafer W from the side when the lift pin plate 20 is in the lower position as shown in FIG. 2, whereas the substrate support 31 is away from the wafer W when the lift pin plate 20 is in the upper position as shown in FIG. 3. In particular, as the lift pin plate 20 moves downward to the lower position, the substrate support 31 is pressed downward by the lower surface of the lift pin plate 20 and pivots on an axis, whereby the substrate support portion 31b of the substrate support 31 moves toward the wafer W from the side. Consequently, referring to FIG. 4, a leftward force is applied to the wafer W and the wafer W is pressed against and held by the two fixing/holding portions 37.

As shown in FIGS. 2 and 3, the processing liquid supply pipe 40 passes through the through-hole 20a of the lift pin plate 20 and the through-hole 30a of the holding plate 30. The processing liquid supply pipe 40 is configured not to rotate upon the rotation of the lift pin plate 20 and the holding plate 30. One or more processing liquid supply passages for a processing liquid(s), such as a rinsing liquid or an etching liquid, are provided within the processing liquid supply pipe 40. In the non-limitative embodiment illustrated in FIGS. 2 and 3, two processing liquid supply passages 40a, 40b are provided within the processing liquid supply pipe 40. As shown in FIGS. 2 and 3, the processing liquid supply pipe 40, at the front end, has the head portion 42 that closes the through-hole 20a of the lift pin plate 20. The head portion 42 has a generally disk-like shape. One or more nozzles are provided in the head portion 42. The nozzle(s) communicates with the processing liquid supply passage(s) provided within the processing liquid supply pipe 40 so that the processing liquid, such as a rinsing liquid or an etching liquid, supplied from the processing liquid supply passage(s) to the nozzle(s) is emitted from the nozzle(s) toward the back surface W2 of the wafer W. It is also possible to use a processing liquid supply pipe which, in addition to the processing liquid supply passage(s) for a processing liquid, such as a rinsing liquid or an etching liquid, also has a gas supply passage for a gas, such as $N_2$ gas. Alternatively, not only a processing liquid but also a gas may be fed to the processing liquid supply passage(s) of a processing liquid supply pipe. In these cases, a gas fed to a gas supply passage or a processing liquid supply passage of such a processing gas supply pipe, is emitted toward a wafer W from a nozzle of the head portion, corresponding to the supply passage.

As shown in FIGS. 2 and 3, a lifting drive section 50 is mounted via a connecting member 52 to the processing liquid supply pipe 40. When the lifting drive section 50 vertically moves the connecting member 52, the processing liquid supply pipe 40, connecting with the connecting member 52, also moves vertically. The lifting drive section 50 vertically moves the processing liquid supply pipe 40 between the lower position shown in FIG. 2 and the upper position shown in FIG. 3.

As shown in FIGS. 2 and 3, a first interlocking member 44 is connected to the processing liquid supply pipe 40. To the first interlocking member 44 are connected a plurality of, e.g. three, rod-like second interlocking members 46 that extend upward from the first interlocking member 44. Each second interlocking member 46 is to make contact with the bottom of each connecting member 24 extending downward from the back surface of the lift pin plate 20. The diameter of the second interlocking member 46 is set smaller than the inner diameter of the cylindrical housing member 32. As shown in FIG. 3, the second interlocking member 46 can push up the connecting member 24 within the housing member 32.

In particular, when the lifting drive section 50 moves the processing liquid supply pipe 40 upward from the position shown in FIG. 2, the first interlocking member 44, connected to the processing liquid supply pipe 40, and the second interlocking members 46 also move upward while each interlocking member 46 pushes up each connecting member 24 within each housing member 32. Consequently, the lift pin plate 20 moves upward in conjunction with the upward movement of the processing liquid supply pipe 40, and the lift pin plate 20 and the processing liquid supply pipe 40 reach the upper positions shown in FIG. 3. On the other hand, when the lifting drive section 50 moves the processing liquid supply pipe downward from the position shown in FIG. 3, each connecting member 24 moves downward together with each second interlocking member 46 while the lower surface of the connecting member 24 keeps in contact with the upper end of the second interlocking member 46 because of the downward force applied to the connecting member 24 by the spring 26 provided within the housing member 32. The lift pin plate 20 and the processing liquid supply pipe 40 thus reach the lower positions shown in FIG. 2.

As shown in FIG. 2, the lift pin plate 20 in the lower position is located adjacent to the holding plate 30. On the other hand, as shown in FIG. 3, the lift pin plate 20 in the upper position is located a distance above the holding plate 30, and a wafer W can be transferred onto and taken out of the lift pins 22.

The first interlocking member 44 and the three second interlocking members 46 constitute an interlocking mechanism for interlocking and vertical moving the lift pin plate 20 and the processing liquid supply pipe 40 together. The first interlocking member 44, the three second interlocking members 46, the lifting drive section 50 and the connecting member 52 constitute a lifting mechanism for vertical moving the lift pin plate 20 and the processing liquid supply pipe 40 relative to the holding plate 30.

As shown in FIGS. 2 and 3, of the processing liquid supply passages 40a, 40b provided within the processing liquid supply pipe 40, the processing liquid supply passage 40a is connected to an etching liquid supply system 40A. An etching liquid, containing hydrofluoric acid and sulfuric acid, is fed from the etching liquid supply system 40A to the processing liquid supply passage 40a.

The processing liquid supply passage 40b of the processing liquid supply pipe 40 is connected to a rinsing liquid supply system 40B. Pure water (rinsing liquid) is fed from the rinsing liquid supply system 40B to the processing liquid supply passage 40b.

The operation of the etching liquid supply system 40A and the operation of the rinsing liquid supply system 40B are both controlled by a controller 3.

Above the holding plate 30 and the lift pin plate 20 are provided a first laser displacement meter 4 for measuring a displacement of the center of the front surface W1 of a wafer W held by the holding plate 30, and a second laser displacement meter 5 for measuring a displacement of the periphery of the front surface W1 of the wafer W. Signals from the first laser displacement meter 4 and the second laser displacement meter 5 are sent to the controller 3.

The first laser displacement meter 4 and the second laser displacement meter 5 constitute a substrate warpage detection section.

In particular, the first laser displacement meter 4 and the second laser displacement meter 5 respectively emit laser light toward the center and the periphery of the front surface W1 of the wafer W and, based on reflected light from the wafer W, measure displacements of the center and the periphery of the front surface W1 of the wafer W.

Signals from the first laser displacement meter 4 and the second laser displacement meter 5 are sent to the controller 3. Based on the signals, the controller 3 determines the degree of warpage of the wafer W. When the controller 3 determines that warpage of the wafer W has decreased and fallen within a predetermined range, the controller 3 stops the supply of an etching liquid from the etching liquid supply system 40A.

The controller 3 controls the operations of all the functional components (such as the etching liquid supply system 40A and the rinsing liquid supply system 40B) of the substrate warpage removal apparatus 10. The controller 3 may comprise a general-purpose computer as hardware and, as software, programs (e.g. an apparatus control program, a processing recipe, etc.) for operating the computer. The software is stored in a storage medium such as a hard disk drive, which is fixedly provided in the computer, or in a storage medium such as a CD-ROM, a DVD or a flash memory, which is detachably set in the computer. Such a storage medium is shown by reference numeral 3a. A processor 3b, e.g. based on an instruction from a not-shown user interface, invokes a predetermined processing recipe from the storage medium 3*a* and executes the recipe, as necessary, so that the functional components of the wet etching apparatus operate to perform predetermined processing under the control of the controller 3.

A substrate warpage removal method, performed by means of the substrate warpage removal apparatus 10, will now be described.

First, a wafer W is carried into the resist pattern forming apparatus 1 shown in FIG. 9. In the resist pattern forming apparatus 1, the wafer W is subjected to warpage removal processing in the substrate warpage removal apparatus 10 located in a most upstream position in the second block B2.

The wafer W has previously been subjected to film forming processing by CVD or PVD to form a multi-layer film F (see FIG. 1(*a*)) on the front surface W1 and the back surface W2, followed by etching of the front surface W1 to form a pattern P in the film F1 (see FIG. 1(*b*)).

While the film F1 having the pattern P has thus been formed on the front surface W1 of the wafer W, the back surface W2 has not been subjected to etching. Therefore, a film F2 having no pattern remains in the back surface W2 of the wafer W.

Thus, having undergone film forming processing and etching, the wafer W, to be carried into the substrate warpage removal apparatus 10 in the resist pattern forming apparatus 1, has the film F1 with the pattern P in the front surface W1 and has the film F2 without a pattern in the back surface W2 as shown in FIG. 1(*b*).

When the film F is formed in the front surface W1 and the back surface W2 of a wafer W, the internal stress of the film F of the front surface W1 balances the internal stress of the film F of the back surface W2, and therefore the wafer W maintains the shape of a flat plate (FIG. 1(*a*)). On the other hand, when a wafer W has the film F1 with the pattern P in the front surface W1 and has the film F2 without a pattern in the back surface W2, there will be some imbalance between the internal stress of the film F1 of the front surface W1 and the internal stress of the film F2 of the back surface W2, causing the wafer W to warp with the front surface W1 convex.

Warpage of the wafer W is removed by means of the substrate warpage removal apparatus 10 so that processing of the wafer W in the resist pattern forming apparatus 1, comprising application of a resist onto the wafer W, heating of the resist to form a resist film, exposure of the resist film and development of the exposed resist film, in particular the exposure processing, can be performed with good accuracy.

The removal of warpage of the wafer W is effected by removing the film F2, formed in the back surface W2 of the wafer W, in the substrate warpage removal apparatus 10 as will be described later (FIG. 1(*c*)).

The removal of the film F2 can balance the internal stress of the film F1 of the front surface W1 and the internal stress of the film F2 of the back surface W2, and therefore can return the wafer W to the original flat shape.

For the wafer W whose warpage has been removed and which has returned to the original flat shape, a resist pattern can be formed with good accuracy in the resist pattern forming apparatus 1.

The operation of the substrate warpage removal apparatus 10 will now be described in greater detail.

First, the lift pin plate 20 and the processing liquid supply pipe 40 are raised by means of the lifting mechanism to the upper positions shown in FIG. 3 (see step 1 of FIG. 8). Next, as shown by the dashed-double dotted lines in FIG. 3, a wafer W is transported by a transport arm 104 to the substrate warpage removal apparatus 10 and placed on the lift pins 22 of the lift pin plate 20 (see step 2 of FIG. 8). At this point, because of the presence of the film P1 with the pattern P on the front surface W1 and the presence of the film F2 without a pattern on the back surface W2, the wafer W is warped with the front surface W1 convex.

Next, the controller 3 controls the lifting drive section 50 to move the processing liquid supply pipe 40 from the upper position to the lower position. Because of the downward force applied to each connecting member 24 by the spring 26 provided within each housing member 32, the lift pin plate 20 also moves downward, from the upper position to the lower position, in conjunction with the downward movement of the processing liquid supply pipe 40 (see step 3 of FIG. 8). When the lift pin plate 20 moves downward, the substrate support 31 is pressed downward by the lower surface of the lift pin plate 20, whereby the substrate support 31 pivots on an axis. Consequently, the substrate support portion 31*b* of the substrate support 31 moves toward the wafer W from the side, and the wafer W becomes supported by the substrate support 31 from the side. The wafer supported by the substrate support 31 is positioned at a small distance above the lift pins 22.

After the lift pin plate 20 and the processing liquid supply pipe 40 have reached the lower positions shown in FIG. 2, the controller 3 controls the rotational drive section 39 to rotate the holding plate 30. Because each connecting member 24, provided on the back surface of the lift pin plate 20, is housed in each housing member 32 provided on the back surface of the holding plate 30, the lift pin plate 20 also rotates in conjunction with the rotation of the holding plate 30. The wafer W also rotates by the rotation of the holding plate 30. The processing liquid supply pipe 40 remains stationary when the holding plate 30 rotates.

Next, while rotating the wafer W, the controller 3 actuates the etching liquid supply system 40A so that an etching liquid is supplied from the etching liquid supply system 40A into the processing liquid supply passage 40*a* of the processing liquid supply pipe 40, and the etching liquid is supplied from the processing liquid supply passage 40*a* to the back surface W2 of the wafer W (see step 4 of FIG. 8).

The film F2 without a pattern, formed in the back surface W2 of the wafer W, is removed gradually by supplying the etching liquid to the back surface W2. Accordingly, the internal stress of the film F1 of the front surface W1 and the internal stress of the film F2 of the back surface W2 become gradually balanced or equal, and therefore warpage of the wafer W gradually decreases.

During the etching, a displacement of the center of the front surface W1 of the wafer W is measured with the first laser displacement meter 4 and a displacement of the periphery of the front surface W1 of the wafer W is measured with the second laser displacement meter 5. Signals from the first laser displacement meter 4 and the second laser displacement meter 5 are sent to the controller 3. Based on the signals, the controller 3 detects the degree of warpage of the wafer W. When the detected degree of warpage has fallen within a predetermined range, the controller 3 determines that warpage of the wafer W has been eliminated (step 5), and stops the actuation of the etching liquid supply system 40A (step 6).

Subsequently, the controller 3 actuates the rinsing liquid supply system 40B so that pure water (rinsing liquid) is supplied from the rinsing liquid supply system 40B into the processing liquid supply passage 40*b* of the processing liquid supply pipe 40. The rinsing liquid is supplied from the processing liquid supply passage 40*b* to the back surface W2 of the wafer W to perform rinsing of the wafer W (step 7).

During the rinsing, the controller 3 keeps the holding plate 30 and the lift pin plate 20 rotating, and the wafer W keeps rotating.

After completion of the rinsing of the wafer W, drying of the wafer W is performed by further rotating the wafer W. Thereafter, the lifting drive section 50 moves the processing liquid supply pipe 40 from the lower position to the upper position. Because each second interlocking member 46 pushes up each connecting member 24, the lift pin plate 20 also moves upward, from the lower position to the upper position, in conjunction with the upward movement of the processing liquid supply pipe 40 (see step 8 of FIG. 8). When the lift pin plate 20 moves upward, due to a biasing force applied by a spring member to the substrate support 31, the substrate support 31 pivots on an axis in the clockwise direction in FIG. 3. Thus, the substrate support 31 moves laterally away from the wafer W, whereby the wafer W becomes supported by the lift pins 22 from the back surface.

After the lift pin plate 20 and the processing liquid supply pipe 40 have reached the upper positions shown in FIG. 3, the wafer W on the lift pins 22 is taken by the transport arm 104 out of the lift pins 22 (see step 9 of FIG. 8) and transported to the outside of the substrate warpage removal apparatus 10. The sequence of warpage removal operations for the wafer W is thus completed. Thereafter, the wafer W is subjected to a resist pattern forming process in the resist pattern forming apparatus 1.

As described hereinabove, according to this embodiment, warpage of a wafer W can be removed by means of the substrate warpage removal apparatus 10 provided in a most upstream position in the resist pattern forming apparatus 1. This makes it possible to perform the subsequent resist pattern forming processing (exposure), heating, cooling, etc. with good accuracy.

In particular, warpage of a wafer W can be removed by removing the film F2, formed in the back surface W2 of the wafer W, with an etching liquid supplied to the back surface W2. In addition, during the etching, the controller 3 determines the degree of warpage of the wafer W based on signals from the first laser displacement meter 4 and the second laser displacement meter 5 and, when it determines removal of the wafer warpage, stops the supply of the etching liquid. This method can remove the warpage of the wafer W simply, securely and accurately.

While the present invention has been described with reference to the case where a wafer W is warped with the front surface (upper surface) convex, the present invention can also be applied to the case where a wafer W is warped with the front surface (upper surface) concave. Though in the above-described embodiment the substrate warpage removal apparatus 10 is incorporated in the resist pattern forming apparatus 1, it is also possible to separately install the substrate warpage removal apparatus 10 upstream of the resist pattern forming apparatus 1. Instead of the use as a film removal section of the processing liquid supply pipe 40 for supplying an etching liquid, it is possible to use a CMP (chemical mechanical polishing) apparatus to remove a film F2 formed in the back surface W2 of a wafer W.

What is claimed is:

1. A substrate warpage removal apparatus comprising:
    a substrate holding section configured to hold a substrate which has a patterned surface having a film with a pattern, and a non-patterned surface lying on the opposite side from the patterned surface and having a film without a pattern, wherein the substrate holding section holds a periphery of the substrate, holds the substrate with the non-patterned surface downward, and has a rotational driving section for rotating the substrate;
    a film removal section, provided beneath the substrate on the side of the non-patterned surface of the substrate, configured to remove the film of the non-patterned surface;
    a substrate warpage detection section configured to detect a degree of warpage of the substrate,
    wherein the substrate warpage detection section includes a first laser displacement meter configured to measure a displacement of the center of a surface of the substrate, and a second laser displacement meter configured to measure a displacement of the periphery of the surface of the substrate, and wherein the substrate warpage detection section is disposed above the substrate, and detects a warpage of the substrate while the substrate is rotated and a process liquid is supplied to the non-patterned surface of the rotated substrate; and
    a controller configured to control the film removal section, wherein the film removal section includes a processing liquid supply section provided on the side of the non-patterned surface of the substrate, wherein the processing liquid supply section includes a processing liquid supply pipe which is connected to an etching liquid supply system configured to supply an etching liquid to the processing liquid supply pipe, wherein the controller determines when to stop the actuation of the film removal section based on a signal from the substrate warpage detection section, and wherein the supply of etching liquid from the processing liquid supply section gradually removes at least a portion of the film without a pattern to balance internal stress in the substrate,
    the substrate warpage detection system detects displacement of the substrate and sends the detected displacement in signals to the controller, and the controller determines a remaining degree of warpage of the substrate while the processing liquid supply section is supplying the etching liquid to the film without a pattern; and
    the controller determines that the warpage of the substrate has been eliminated based on the detected displacement in the signals received from the substrate warpage detection system, the controller stops the actuation of the processing liquid supply section which is disposed below the substrate to stop the supply of etching liquid to the film without a pattern on the substrate, and actuates a supply of rinsing liquid to the film without a pattern on the substrate, while the substrate continues to rotate.

2. A substrate processing apparatus comprising:
    the substrate warpage removal apparatus according to claim 1;
    a resist application module configured to apply a liquid resist to a substrate after removing warpage of the substrate by means of the substrate warpage removal apparatus; and
    a substrate transport means configured to transport the substrate between the substrate warpage removal apparatus and the resist application module.

* * * * *